United States Patent
Javor

(10) Patent No.: US 6,952,144 B2
(45) Date of Patent: Oct. 4, 2005

(54) APPARATUS AND METHOD TO PROVIDE POWER AMPLIFICATION

(75) Inventor: Ronald D. Javor, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 10/463,725

(22) Filed: Jun. 16, 2003

(65) Prior Publication Data

US 2004/0251984 A1 Dec. 16, 2004

(51) Int. Cl.[7] ............................................... H03H 7/38
(52) U.S. Cl. ........................ 333/32; 333/253; 330/144
(58) Field of Search ........................... 333/32, 253, 263; 330/282, 86, 144

(56) References Cited

U.S. PATENT DOCUMENTS 6,255,906 B1    7/2001  Eidson et al.
6,566,944 B1 *  5/2003  Pehlke et al. ................. 330/10
2003/0076174 A1  4/2003  Tanoue et al.

OTHER PUBLICATIONS

PCT Search Report Dated Oct. 22, 2004.

* cited by examiner

Primary Examiner—Daniel D. Chang
(74) Attorney, Agent, or Firm—Lanny P. Parker

(57) ABSTRACT

Briefly, in accordance with an embodiment of the invention, an apparatus and method to increase efficiency of a power amplifier is provided. The apparatus may include a power amplifier, and a variable impedance matching circuit coupled to the power amplifier to improve the transmitter efficiency over a range of output power. The variable impedance matching circuit may be adapted to match the output impedance of the power amplifier. The method may include varying the impedance of a circuit coupled to the output of a power amplifier during operation of the power amplifier to match the output impedance of the power amplifier.

15 Claims, 2 Drawing Sheets under the United States Patent and Trademark Office

APPARATUS AND METHOD TO PROVIDE POWER AMPLIFICATION

BACKGROUND

Some portable devices such as, for example, laptop computers, cell phones, or personal digital assistants (PDAs), use batteries to power these electronic devices. Battery life for these devices may be improved by decreasing the power consumption of these devices. System designers are continually searching for alternate ways to reduce power consumption in electronic devices.

BRIEF DESCRIPTION OF THE DRAWINGS

The subject matter regarded as the invention is particularly pointed out and distinctly claimed in the concluding portion of the specification. The present invention, however, both as to organization and method of operation, together with objects, features, and advantages thereof, may best be understood by reference to the following detailed description when read with the accompanying drawings in which:

Figure 1:
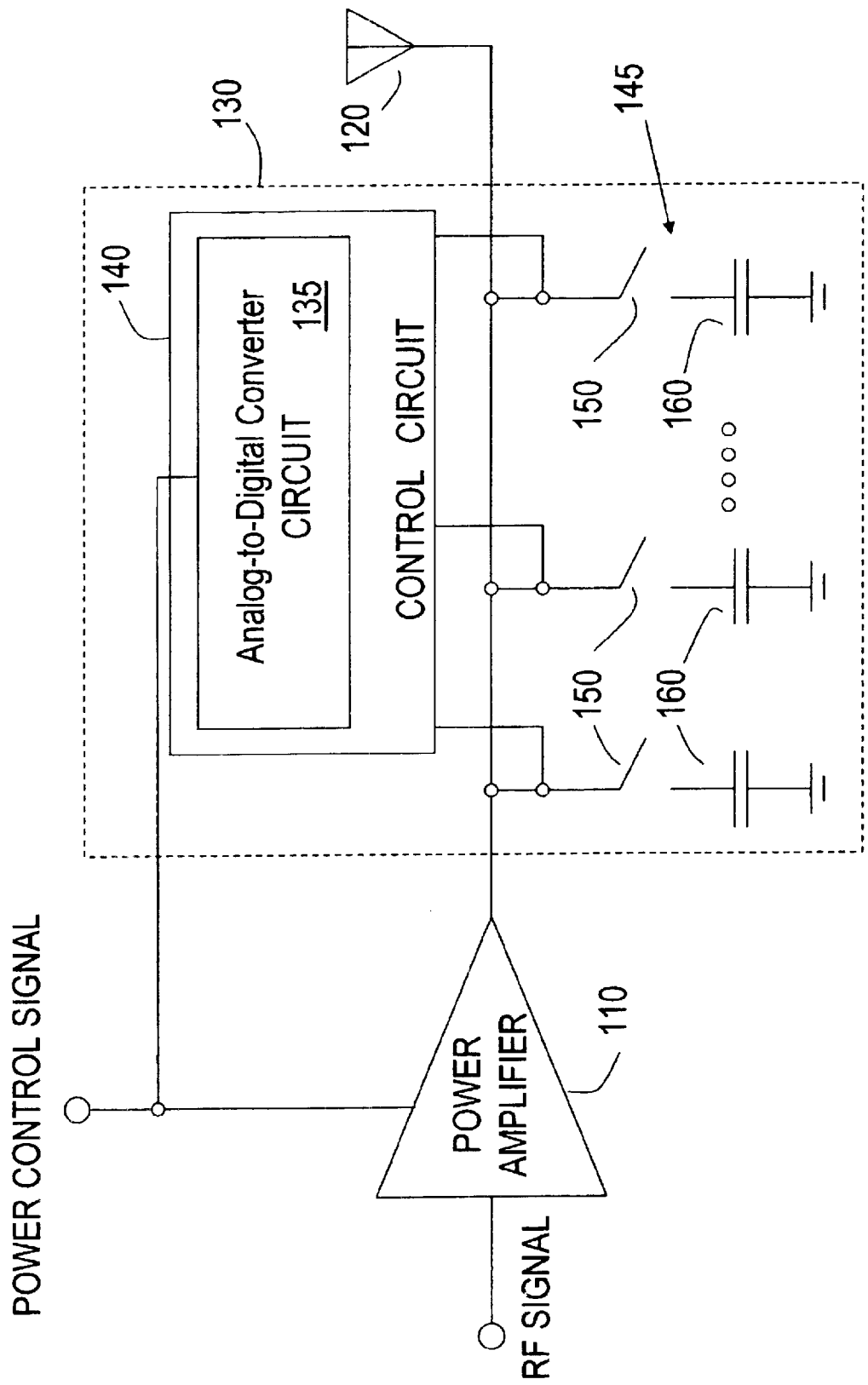
FIG. 1 is a schematic diagram illustrating a portion of a transmitter in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the present invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Turning to FIG. 1, an embodiment of a portion of a portion of a transmitter 100 is illustrated. Transmitter 100 may comprise or include a power amplifier 110 having a first input terminal coupled to receive a radio frequency (RF) signal, labeled RF SIGNAL, and a second input terminal coupled to receive a power control signal, labeled POWER CONTROL SIGNAL.

Transmitter 100 may further include an antenna 120 coupled to an output terminal of power amplifier 110 and may include a variable impedance matching circuit 130 coupled to the output terminal of power amplifier 110. Variable impedance matching circuit 130 may also have an input terminal coupled to receive POWER CONTROL SIGNAL.

Variable impedance matching circuit 130 may be referred to as a matching network and may include a control circuit 140 coupled to an impedance circuit 145. Impedance circuit 145 may include a plurality of switches 150 coupled to a plurality of capacitors 160. In one embodiment, when switches 150 are in a closed position, capacitors 160 may be coupled to each other in parallel and provide an impedance at the output terminal of power amplifier 110. The impedance of impedance circuit 145 may be altered by selectively switching in and out one or more of capacitors 160 using switches 150 during operation of power amplifier 110. The impedance of impedance circuit 145 may be altered to dynamically match the output impedance of power amplifier 110. The phrase "matching the output impedance of power amplifier 110" may mean providing an impedance at the output terminal of power amplifier 110 that may be substantially equal to the output impedance of power amplifier 110. As an example, the output impedance of power amplifier 110 may be measured from the outside looking in with, for example, a network analyzer or an impedance bridge.

Capacitors 160 may have the same capacitance values or different values and may also be referred to as shunt capacitors. Switches 150 and capacitors 160 may be referred to as a switched-capacitor circuit. Although switches 150 are described as being part of impedance circuit 145, this is an arbitrary designation and not a limitation of the present invention.

Although three capacitors coupled to three switches are shown in FIG. 1, this is not a limitation of the present invention. In alternate embodiments, more or less than three banks of capacitors and switches may be used. In addition, in other embodiments, impedance circuit 145 may include inductors and/or resistors instead of, or in addition to, capacitors 160 to provide an impedance at the output terminal of power amplifier 110.

In one embodiment, switches 150 may be relatively low resistance switches such as, for example, microelectromechanical systems (MEMS) switches. A MEMS switch may be a mechanical switch implemented using semiconductor materials and processes. In alternate embodiments, switches 150 may be implemented using transistors or diodes. For example, switches 150 may be implemented using PIN diodes, although the scope of the present invention is not limited in this respect.

Power amplifier 110 may be a high-frequency amplifier or an RF amplifier adapted to receive RF SIGNAL having a carrier frequency greater than zero hertz. In one embodiment, a high-frequency amplifier may refer to an amplifier that amplifies signals having carrier frequencies greater than about 50 megahertz (MHz). Power amplifier 110 may amplify RF SIGNAL to generate an amplified RF signal at its output terminal that may be transmitted to antenna 120 for transmission over the air.

POWER CONTROL SIGNAL may be used to vary the gain of power amplifier 110, so that the output power of power amplifier 110 may be varied or altered using POWER CONTROL SIGNAL. In addition, as discussed below, POWER CONTROL SIGNAL may be used to alter the impedance of variable impedance matching circuit 130. Although the scope of the present invention is not limited in this respect, in one embodiment, POWER CONTROL SIGNAL may be an analog voltage signal. In this embodiment, the output power of power amplifier 110 may be altered by varying the level of the analog voltage signal.

In one embodiment, variable impedance matching circuit 130 may be coupled to the output terminal of power amplifier 110 to dynamically match the output impedance of power amplifier 110 during operation of power amplifier 110, which may improve efficiency of power amplifier 110. As the output power of power amplifier 110 changes, the output impedance of power amplifier 110 may also change resulting in a non-matched impedance condition at the output terminal of power amplifier 110. This may reduce the efficiency of power amplifier 110 resulting in wasted power. However, since variable impedance matching circuit 130 is adapted to dynamically match the output impedance of power amplifier 110 during operation of power amplifier 110, this may increase efficiency of power amplifier 110.

Control circuit 140 may be adapted to alter the impedance of impedance circuit 145 based on the output power of power amplifier 110. For example, control circuit 140 may control the position of switches 150. In addition, control circuit 140 may be adapted to receive POWER CONTROL SIGNAL and to alter the impedance of impedance circuit 145 based on a value or level of POWER CONTROL SIGNAL, which may also be used to control the output power of power amplifier 110. Thus, control circuit 140 may be capable of improving efficiency of power amplifier 110 over a range of output power by varying the impedance of variable impedance matching circuit 130 to match the output impedance of power amplifier 110 during operation of power amplifier 110.

In one embodiment, control circuit 140 may be a processor such as, for example, a microprocessor, a digital signal processor (DSP), a microcontroller, or the like. In the embodiment wherein POWER CONTROL SIGNAL is an analog signal, control circuit 140 may include an analog-to-digital (A/D) converter 135 coupled to receive POWER CONTROL SIGNAL and generate a digital signal in response to and correlated to POWER CONTROL SIGNAL. Further, control circuit 140 may also include a digital logic circuit (not shown) coupled to the A/D converter 135 to receive the digital signal and adapted to after the impedance of impedance circuit 145 in response to the digital signal.

Although the scope of the present invention is not limited in this respect, in one embodiment, control circuit 140 may be adapted to decrease the impedance of impedance circuit 145 if the output power of power amplifier 110 increases during operation of the power amplifier. Decreasing the impedance of impedance circuit 145 may be accomplished by, for example, closing one or more of switches 150. Control circuit 140 may be adapted to increase the impedance of impedance circuit 145 if the output power of power amplifier 110 decreases during operation of power amplifier 110. Increasing the impedance of impedance circuit 145 may be accomplished by, for example, opening one or more of switches 150. Thus, the impedance of circuit 130 may be varied by selectively switching in and out one or more of capacitors 160 during operation of power amplifier 110 to match the output impedance of power amplifier 110.

Variable impedance matching circuit 130 and/or power amplifier 110 may be disabled when transmitter 100 is not operating in a transmit mode.

Figure 2:
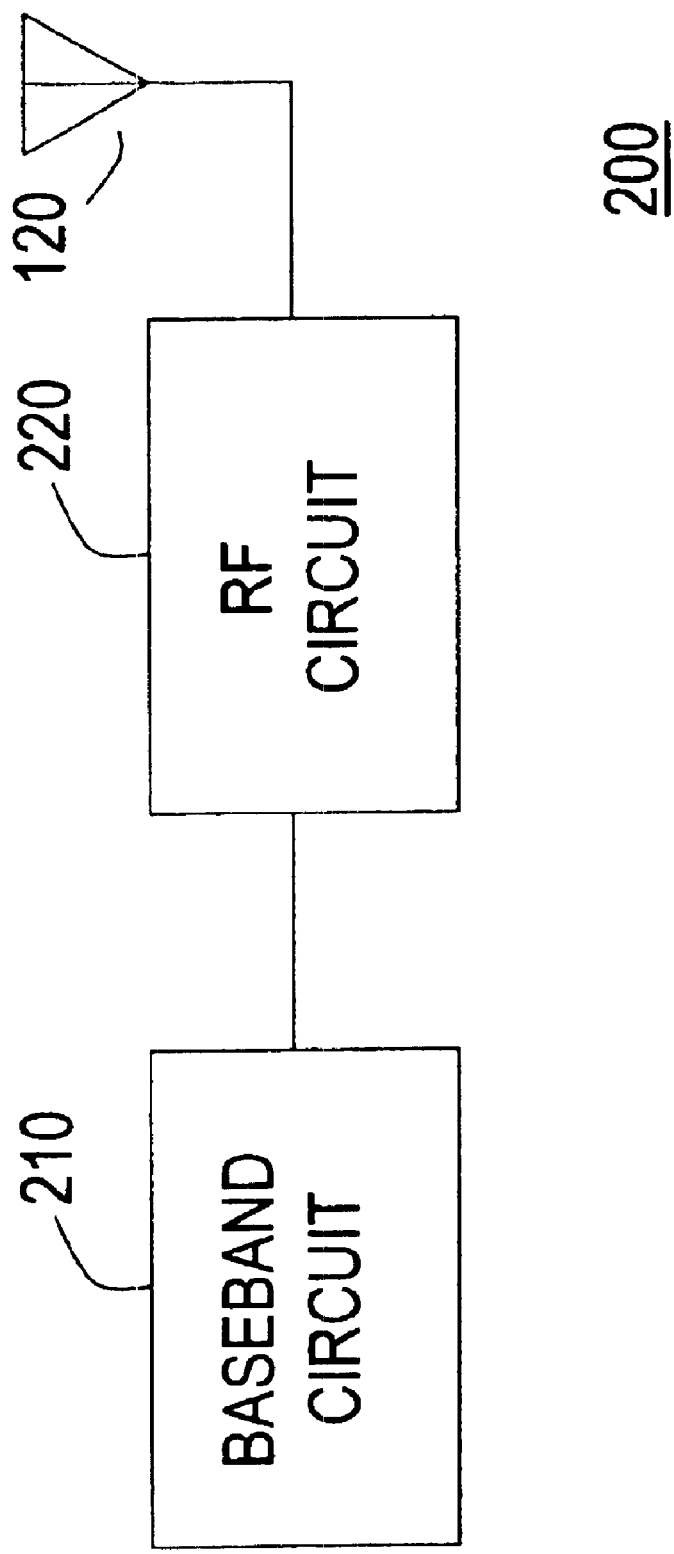
FIG. 2 is a block diagram illustrating a portion of a wireless device in accordance with an embodiment of the present invention.

FIG. 2 is a block diagram of a portion of a wireless device 200 in accordance with an embodiment of the present invention. Wireless device 200 may be a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. Wireless device 200 may be used in any of the following systems: a wireless personal area network (WPAN) system, a wireless local area network (WLAN) system, or a cellular network, although the scope of the present invention is not limited in this respect.

As shown in FIG. 2, in one embodiment wireless device 200 may include a baseband circuit 210, an RF circuit 220, and an antenna 120. Antenna 120 may be a monopole antenna or a dipole antenna.

RF circuit 220 may include transmitter 100 illustrated in FIG. 1. That is, RF circuit 220 may include power amplifier 110 and variable impedance matching circuit 130 discussed with reference to FIG. 1.

Baseband circuit 220 may be adapted to process information using WPAN, WLAN, or cellular protocols. Examples of cellular protocols include: Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, or the like.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus, comprising:

a power amplifier;

an impedance circuit located between an antenna and the power amplifier;

an analog-to-digital (A/D) converter coupled to receive the analog control signal and generate a digital signal in response to and correlated to the analog signal; and a circuit coupled to the A/D converter to receive the digital signal and alter an impedance of the impedance circuit in response to the digital signal.

2. The apparatus of claim 1, wherein the variable impedance matching circuit includes:

a control signal used to disable the impedance circuit when the power amplifier is not operating in a transmit mode.

3. The apparatus of claim 1, wherein the impedance circuit dynamically adjusts an impedance provided to the power amplifier that substantially matches an output impedance of the power amplifier.

4. The apparatus of claim 1, wherein the digital signal alters the impedance of the impedance circuit based on a level of the analog signal.

5. An apparatus, comprising:

a power amplifier having an input to receive a control signal to control the output power of the power amplifier; and an impedance circuit located between an antenna and the power amplifier that selectively switches capacitance onto an output of the power amplifier in accordance with the control signal.

6. The apparatus of claim 5, wherein the control signal is used to disable the impedance circuit when the power amplifier is not operating in a transmit mode.

7. The apparatus of claim 6, wherein the impedance of the impedance circuit is decreased if the output power of the power amplifier increases during operation of the power amplifier and the impedance of the impedance circuit is increased if the output power of the power amplifier decreases during operation of the power amplifier.

8. A method, comprising:

using an analog-to-digital (A/D) converter to convert an analog control signal to a digital signal; and varying an impedance of an impedance circuit coupled to an output of a power amplifier in response to the digital signal during operation of the power amplifier.

9. The method of claim 8, further comprising using a control signal to disable the impedance circuit when the power amplifier is not operating in a transmit mode.

10. The method of claim 8, wherein varying includes decreasing the impedance of the impedance circuit if the output power of the power amplifier increases during operation of the power amplifier.

11. The method of claim 8, wherein varying includes increasing the impedance of the impedance circuit if the output power of the power amplifier decreases during operation of the power amplifier.

12. The method of claim 8, wherein the impedance circuit includes a plurality of switches coupled to a plurality of capacitors so that the impedance of the impedance circuit is varied by selectively switching in and out one or more of the capacitors during operation of the power amplifier.

13. A system, comprising:

a power amplifier;

a variable impedance matching circuit coupled to the power amplifier, wherein the variable impedance matching circuit is adapted to match the output impedance of the power amplifier and disabled when the power amplifier is not operating in a transmit mode; and a monopole antenna coupled to the variable impedance matching circuit.

14. The system of claim 13, further comprising a baseband circuit coupled to the power amplifier, wherein the baseband circuit is adapted to process information using a cellular protocol.

15. The apparatus of claim 13, wherein the variable impedance matching circuit includes:

an impedance circuit; and a control circuit adapted to alter the impedance of the control circuit during operation of the power amplifier.

* * * * *

UNITED STATES PATENT AND TRADEMARK OFFICE
CERTIFICATE OF CORRECTION

PATENT NO. : 6,952,144 B2
DATED : October 4, 2005
INVENTOR(S) : Javor

It is certified that error appears in the above-identified patent and that said Letters Patent is hereby corrected as shown below:

Column 3,
Line 41, delete "after" and insert -- alter --.

Signed and Sealed this

Twentieth Day of December, 2005

JON W. DUDAS
*Director of the United States Patent and Trademark Office*